(12) United States Patent
Patel

(10) Patent No.: US 8,269,345 B2
(45) Date of Patent: Sep. 18, 2012

(54) BUMP I/O CONTACT FOR SEMICONDUCTOR DEVICE

(75) Inventor: Pradip D. Patel, Redwoody City, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 1336 days.

(21) Appl. No.: 11/871,096

(22) Filed: Oct. 11, 2007

(65) Prior Publication Data

US 2009/0096092 A1 Apr. 16, 2009

(51) Int. Cl.
*H01L 23/52* (2006.01)
*H01L 21/00* (2006.01)
*H01L 23/48* (2006.01)
*H01L 29/40* (2006.01)

(52) U.S. Cl. ......... 257/737; 257/E21.508; 257/E23.021; 257/E23.033; 257/E23.068; 257/E23.026; 257/E23.027; 257/E23.028; 438/613

(58) Field of Classification Search .................. 257/737, 257/E21.508, E23.021, E23.026–E23.028, 257/E23.033, E23.068; 438/613
See application file for complete search history.

(56) References Cited

U.S. PATENT DOCUMENTS

| | | | |
|---|---|---|---|
| 6,271,107 B1 | 8/2001 | Massingill et al. | |
| 6,375,062 B1 | 4/2002 | Higdon et al. | |
| 2002/0142508 A1 | 10/2002 | Munch | |
| 2002/0149105 A1 | 10/2002 | Yoon et al. | |
| 2003/0136814 A1 | 7/2003 | Furman et al. | |
| 2006/0016861 A1 | 1/2006 | Daubenspeck et al. | |
| 2006/0223313 A1* | 10/2006 | Yoon et al. | 438/687 |
| 2007/0096313 A1 | 5/2007 | Chou et al. | |

* cited by examiner

*Primary Examiner* — J. H. Hur
(74) *Attorney, Agent, or Firm* — North Weber & Baugh LLP

(57) ABSTRACT

A bump contact electrically connects a conductor on a substrate and a contact pad on a semiconductor device mounted to the substrate. The first end of an electrically conductive pillar effects electrical contact and mechanical attachment of the pillar to the contact pad with the pillar projecting outwardly from the semiconductor device. A solder crown reflowable at a predetermined temperature into effecting electrical contact and mechanical attachment with the conductor is positioned in axial alignment with the second end of the pillar. A diffusion barrier electrically and mechanically joins the solder bump to the second end of the pillar and resists electro-migration into the first end of the solder crown of copper from the pillar. One diffusion barrier takes the form of a 2-20 micron thick control layer of nickel, palladium, titanium-tungsten, nickel-vanadium, or tantalum nitride positioned between the pillar and the solder crown.

17 Claims, 12 Drawing Sheets

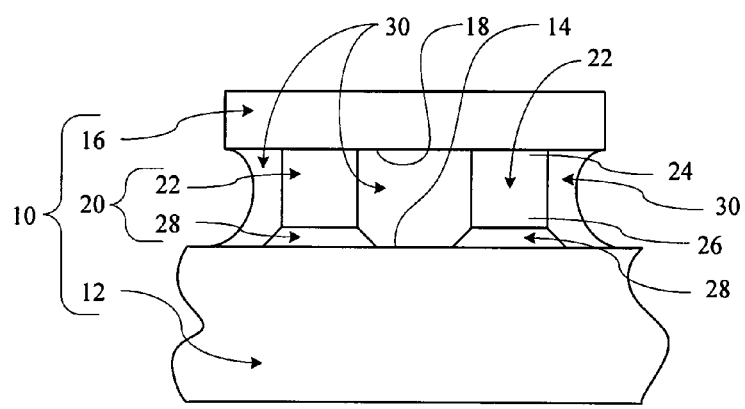
Figure 1
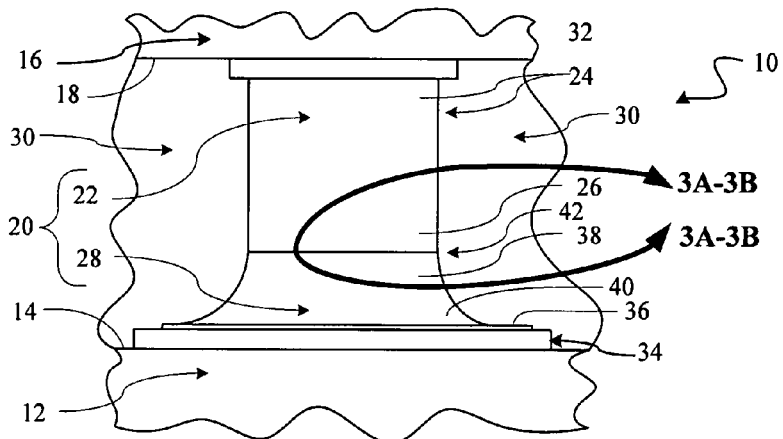
Figure 2
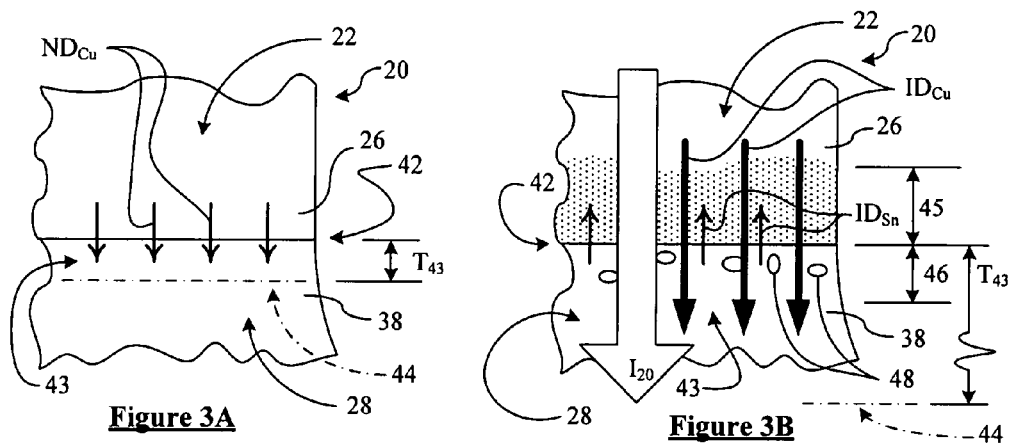
Figure 3A
Figure 3B

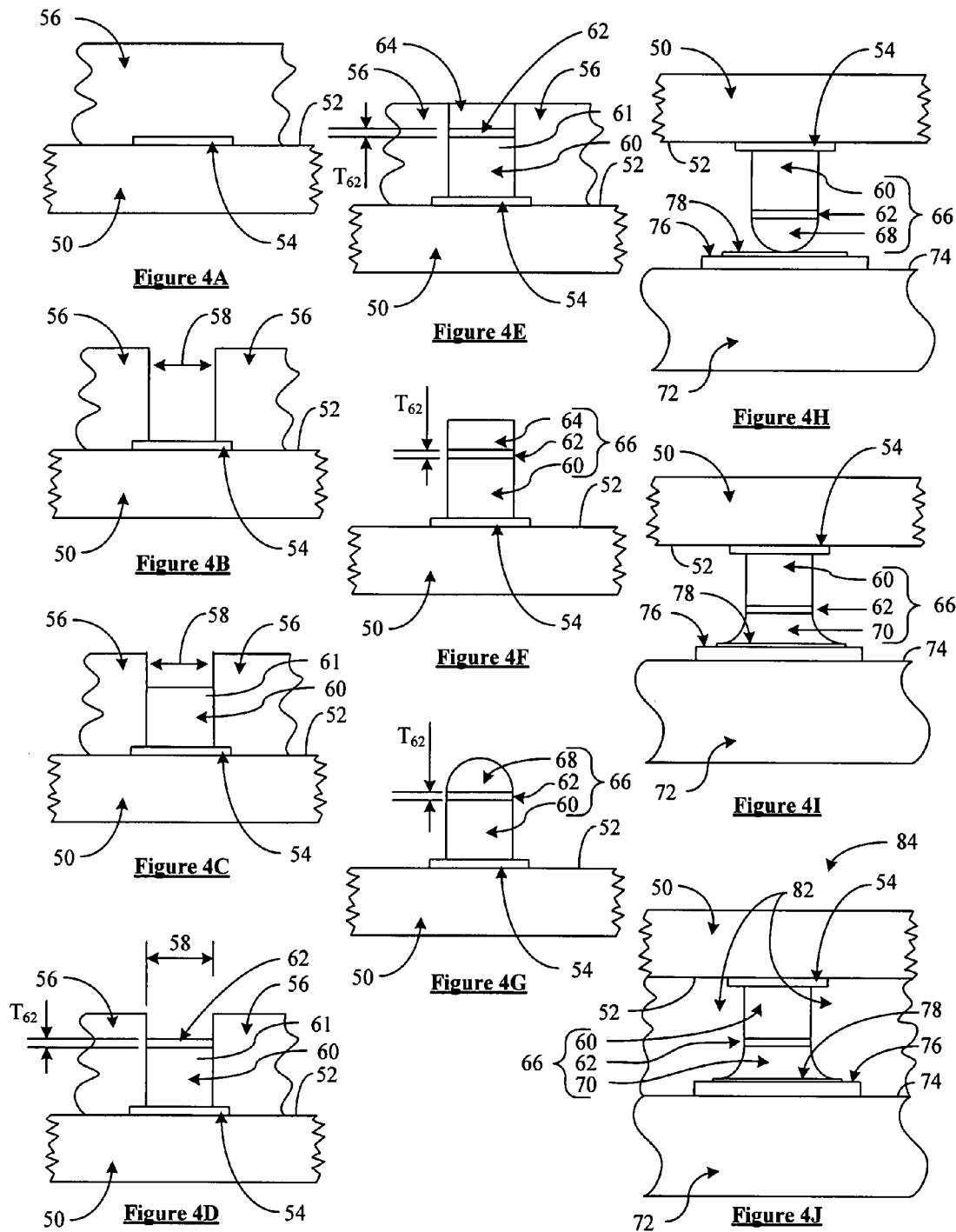

BUMP I/O CONTACT FOR SEMICONDUCTOR DEVICE

BACKGROUND

A. Technical Field

The present invention relates generally to contacts for electrically connecting a substrate and a semiconductor device mounted to the substrate. More particularly, the present invention pertains to the bump contacts that are employed in the flip-chip packaging of semiconductor devices to electrically couple contact pads on a semiconductor device with a substrate to which the semiconductor device is mounted.

B. Background of the Invention

Bump contacts streamline the packaging of semiconductor devices by eliminating the use of electrical leads to connect each of the numerous contact pads on a semiconductor device to corresponding conductors on a support substrate to which the semiconductor device is mounted. Neither the gossamer quality of such electrical leads, nor the substantial number required in order to effect necessary electrically communications for even a single semiconductor device, are optimally suited to efficient industrial manufacturing processes.

Furthermore, a bump contact between a contact pad on a semiconductor device and conductor on a support substrate reduces dramatically the electrical distance between the contact pad and the conductor relative to that attainable using an electrical lead. In contrast with such electrical leads, a bump contact has only a single end at which attachment is required, and attachment effected through bump contacts are considerably more mechanically robust than the attachments that arise at either of an electrical lead.

SUMMARY OF THE INVENTION

The present invention embraces refinements in the packaging of semiconductor devices. The use of the present invention results in semiconductor packages that exhibit enhanced mechanical and electrical reliability.

According to one aspect of the present invention, an improved bump contact is provided with which to electrically connect a conductor on a substrate to a contact pad on a semiconductor device mounted to the substrate.

The present invention also involves methods for making electrical connections between contact pads on a semiconductor device and conductors on a support substrate to which the semiconductor device is mounted.

Certain features and advantages of the invention have been generally described in this summary section; however, additional features, advantages, and embodiments are presented herein or will be apparent in view of the drawings, specification, and claims hereof. Accordingly, it should be understood that the scope of the invention is not to be limited by the particular characterizations presented in this summary section.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

FIG. 1 is a schematic elevation view of a semiconductor package that includes a semiconductor device, a support substrate, and a pair of bump contacts therebetween;

FIG. 2 is an enlarged schematic elevation view of a single of the bump contacts of FIG. 1 revealing additional structural aspects of the semiconductor package of FIG. 1;

FIGS. 3A and 3B are enlarged diagrammatic depictions of a portion of the interface between the materially-contrasting pair of major components of the bump contact of FIG. 2, illustrating conditions arising at that interface, initially upon completion of the manufacture of the semiconductor package of FIG. 1, and subsequently after a period of use;

FIGS. 4A-4J are an ordered sequence of schematic elevation views of steps in a first method using teachings of the present invention to effect an electrical connection between a conductor on a support substrate and a contact pad on a semiconductor device mounted on the support substrate;

Figure 5A:
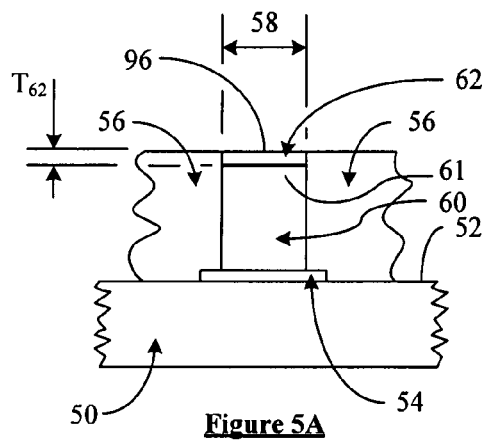
FIGS. 5A-5E are an ordered sequence of schematic elevation views of steps in a second method using teachings of the present invention to effect an electrical connection between a conductor on a support substrate and a contact pad on a semiconductor device mounted on the support substrate.

In the present instance, it has been concluded that the cross hatching traditionally employed in the past in depicting cross-sectional semiconductor structures in figures would serve only to obscure, rather than to enhance, the understanding to be communicated herein of the present invention. Accordingly, in lieu of such traditional practices, cross-sectional cross hatching of structures has been foregone in the above-described figures, and all structures depicted therein have been scrupulously and even redundantly identified by reference characters.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, reformatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

FIG. 1 depicts basic elements of a typical semiconductor package. There, a semiconductor package 10 is shown that includes a support substrate 12 having an engagement surface 14 to which is mounted a semiconductor device 16. Semiconductor device 16 has an electrical access surface 18 that is positioned parallel to and facing engagement surface 14 of support substrate 12. Substantially identical bump contacts 20 extend between electrical access surface 18 of semiconductor device 16 and engagement surface 14 of support substrate 12, electrically coupling semiconductor device 16 with support substrate 12.

Each bump contact 20 includes a pair of materially-contrasting major components. The first of these major components of bump contact 20 is an electrically conductive pillar 22. Pillar 22 is attached at a first end 24 thereof to electrical access surface 18 of semiconductor device 16 in such a manner that pillar 22 projects outwardly from electrical access surface 18 toward engagement surface 14 of support substrate 12. On the free or opposite second end 26 of pillar 22 is located the second major component of bump contact 20, a solder crown that is reflowable at a predetermined temperature into bridging any gap between second end 26 of pillar 22 and engagement surface 14 of support substrate 12. As shown in FIG. 1, to bridge that gap the solder crown at second end 26 of pillar 22 has assumed the form of a reflowed solder crown 28.

The space not occupied by bump contacts 20 between electrical access surface 18 of semiconductor device 16 and engagement surface 14 of semiconductor device 16 is packed by an adhesive fill 30. Adhesive fill 30 enhances the mutual purchase between support substrate 12 and semiconductor device 16, supports the structural integrity of each bump contact 20, and electrically insulates signals on one bump contact 20 from signals on all other bump contacts 20.

FIG. 2 is an enlarged view of a single bump contact 20 from FIG. 1 that reveals additional structural aspects of semiconductor package 10.

Initially, it can be appreciated from FIG. 2 that first end 24 of pillar 22 does not directly engage electrical access surface 18 of semiconductor device 16. Rather, electrical access surface 18 carries a contact pad 32 that communicates electrically in manners not illustrated with appropriate structures in semiconductor device 16. Pillar 22 of bump contact 20 then actually effects direct electrical contact and mechanical attachment with contact pad 32.

A similar structural arrangement is apparent at the opposite end of bump contact 20. FIG. 2 reveals that reflowed solder crown 28 of bump contact 20 does not directly engage electrical access surface 18 of support substrate 12. Instead, electrical access surface 18 carries a conductor 34 that communicates electrically in manners not illustrated with appropriate structures in support substrate 12. Reflowed solder crown 28 of bump contact 20 then actually effects direct electrical contact and mechanical attachment with conductor 34.

In the vicinity of reflowed solder crown 28, the surface of conductor 34 may be provided with a thin flux coating 36 that facilitates reflowed solder crown 28 in achieving an electrical contact and a mechanical attachment to conductor 34. Nonetheless, even when a coating, such as flux coating 36, is employed, the electrical contact and the mechanical attachment thusly effected through the flux coating by a reflowed solder crown will be considered, and will be referred to herein, as one effected directly between the reflowed solder crown and the conductor, as if the flux coating were not present.

Reflowed solder crown 28 extends between a first end 38, which is attached to second end 26 of pillar 22, and a reflow end 40 remote therefrom. The antecedent material from which reflowed solder crown 28 ultimately comes to be comprised is initially attached only to second end 26 of pillar 22 and, being free of attachment to any other structure, is thus secured to what could be considered the tip of bump contact 20. During the assembly of the components of semiconductor package 10 shown in FIG. 2, this antecedent material at the tip of bump contact 20 is placed in proximity to conductor 34 and heated to a predetermined temperature that is sufficient to cause the antecedent material to soften. While the portion of that antecedent material that is attached to second end 26 of pillar 22 remains so attached to become first end 38 of reflowed solder crown 28, the balance of the heat-softened antecedent material sags away from second end 26 of pillar 22 toward and into contact with conductor 34, ultimately assuming the shape of reflow end 40 of reflowed solder crown 28.

Of significance to the present invention, is the region of bump contact 20 in the vicinity of an interface 42, where second end 26 of pillar 22 contacts first end 38 of reflowed solder crown 28. A portion of interface 42 at the right edge of bump contact 20 is shown in enlarged detail in FIGS. 3A and 3B. Adhesive fill 30 has been omitted for convenience to the right of bump contact 20 in FIGS. 3A and 3B.

FIGS. 3A and 3B illustrate with clarity selected problematic material and structural alterations that have been discovered to arise in the vicinity of an interface, such as interface 24. These structural alterations occur as a result of the contrasting material qualities of the metals from which a pillar, such as pillar 22, is constructed and the metallic alloy constituents commonly contained in the solder of an abutting structure, such as reflowed solder crown 28.

Some of the structural alterations arise naturally, either during manufacture, or merely due to the contrasting qualities of different materials placed in permanent contact in a structure. For the purpose of the discussion of the present invention, such natural structural alterations do not significantly impair the reliability or the functionality of a bump contact, and are, therefore, considered to be benign. Nonetheless, yet additional structural alterations are caused by the intended transmission of electric current through a bump contacts during use. Not all of such current-induced structural alterations are similarly benign; rather many are highly problematic. The present invention is directed toward the prevention of such problematic current-induced structural alterations in a bump contact, such as bump contact 20.

In FIG. 3A, interface 42 is shown between second end 26 of pillar 22 and first end 38 of reflowed solder crown 28 immediately following the manufacture of bump contact 20. The contrasting material qualities of the metals from which pillar 22 is constructed and the metallic alloy constituents commonly contained in abutting reflowed solder crown 28 have given rise already to various natural structural alteration in bump contact 20 that are, nonetheless, considered to be benign. One of these benign natural structural alterations will be investigated before proceeding to FIG. 3B.

A pillar, such as pillar 22 of bump contact 20, is most commonly made from copper (Cu), and occasionally from gold (Au). The solder used in a solder crown, such as reflowed solder crown 28 of bump contact 20, is a fusible tin-based alloy comprised primarily of tin (Sn) and lead (Pb) combined with various other metallic elements, such as antimony (Sb), bismuth (Bi), and silver (Ag). Lead-free solder compositions exist in which tin (Sn) predominates in combination with various traces of antimony (Sb), bismuth (Bi), and silver (Ag). In FIGS. 3A and 3B, it will be assumed for the purposes of discussion that pillar 22 is comprised of copper (Cu) and that reflowed solder crown 28 is comprised of a lead-free solder in which tin (Sn) is the major constituent.

At interface 42 of copper (Cu) in pillar 22 with tin (Sn) in reflowed solder crown 28 a natural diffusion $ND_{Cu}$ shown by arrows occurs of copper (Cu) out of pillar 22, across interface 42, and into the immediately adjacent portions of reflowed solder crown 28. As a result, a commingled intermetallic compound phase 43 developed inadvertently within the material matrix of reflowed solder bump 20 in reflowed solder crown 28 adjacent to interface 42. Commingled intermetallic compound phase 43 has a relatively uniform thickness $T_{43}$ measured into reflowed solder crown 28 normal to interface 42. Commingled intermetallic compound phase 43 extends into reflowed solder crown 28 to an irregular boundary that is shown in phantom in FIG. 3A by way of convenience as a linear lower edge 44. Lower edge 44 of commingled intermetallic compound phase 43 is located in close proximity to interface 42.

Commingled intermetallic compound phase 43 is composed of copper (Cu) from pillar 22 that is distributed through the tin (Sn) in the solder of reflowed solder crown 28. That copper (Cu) diffused into reflowed solder crown 28 due to the heat imposed at interface 42, when the antecedent solder material of reflowed solder crown 28 was applied to pillar 22 during manufacture, as well as thereafter simply due to the permanent contact of a region of copper (Cu) with a region of tin (Sn) in a structure, such as bump contact 20. When thusly developed, commingled intermetallic compound phase 43 is stable in size, representing in the extent thereof a state of atomic crystalline equilibrium established between pillar 22 and reflowed solder crown 28. The presence of commingled intermetallic compound phase 43 at the size shown in FIG. 3A causes no significant adverse changes in the mechanical brittleness or in the electrical resistance of bump contact 20.

That equilibrium is, however, disrupted by the use of bump contact 20 to conduct electric current, or by the exposure of bump contact 20 afresh to extremes of high temperature. The consequences of such a disruption of equilibrium in commingled intermetallic compound phase 43 are depicted in FIG. 3B. Some of those consequences can be sufficiently severe as to lead to catastrophic structural failure in bump contact 20.

In FIG. 3B, an electric current $I_{20}$ is shown schematically by an arrow to be flowing through bump contact 20 from pillar 22 and semiconductor device 16 to reflowed solder crown 28 and support substrate 12. As electric current $I_{20}$ traverses interface 42, commingled intermetallic compound phase 43 becomes unstable in size. This leads to further material and structural alterations in the vicinity of interface 42 that degrade the electrical and mechanical performance of bump contact 20. Fresh and undesirable intermetallic compound phases form in the vicinity of interface 42 that exhibit counter-functional electrical and mechanical properties. Some of these undesirable intermetallic compound phases even encompass voids in the material matrix of bump contact 20 in the vicinity of interface 42

According to teachings of the present invention, when bump contact 20 is used to transmit electrical current $I_{20}$, a rapid and substantial induced diffusion $ID_{Cu}$ shown by arrows occurs of copper (Cu) from pillar 22 across interface 42 into commingled intermetallic compound phase 43 in reflowed solder crown 28. Commingled intermetallic compound phase 43 enlarges. Lower edge 44 thereof moves deep into reflowed solder crown 28 in the manner suggested in FIG. 3B by the dimension line associated with thickness $T_{43}$ of commingled intermetallic compound phase 43.

Eventually, commingled intermetallic compound phase 43 becomes saturated with copper (Cu) and is unable to grow further. The continued transmission of electrical current $I_{20}$ through bump contact 20 then commences a counter-diffusion of tin (Sn) out of commingled intermetallic compound phase 43 in reflowed solder crown 28, across interface 42, and into pillar 22, in an induced diffusion $ID_{Sn}$ indicated by arrows in FIG. 3B.

Under these circumstances, the formation occurs of undesirable intermetallic compound phases of copper (Cu) and tin (Sn) that, unlike commingled intermetallic compound phase 43, do exhibit both brittle material properties and increased resistance to the transmission of electrical current $I_{20}$.

The formation of brittle intermetallic compound phases significantly reduces thermo-mechanical fatigue resistance and mechanical shock resistance, causing premature cracking in the vicinity of interface 42 and reducing the structural reliability of bump contact 20. Increased electrical resistance in these intermetallic compound phases leads to unreliability in the electrical functioning of bump contact 20 as an interconnection. Secondarily, higher electrical resistance in bump contact 20 causes any electrical current $I_{20}$ transmitted therethrough to generate substantial heat in the material matrix of bump contact 20 in the vicinity of interface 42. In the manner of a positive feedback, this accelerates the formation of undesirable intermetallic compound phases.

These undesirable intermetallic compound phases are not uniformly distributed throughout bump contact 20, or segregated from each other. Nonetheless, for the sake of clarity, in FIG. 3B the main types of objectionable intermetallic compound phases are depicted in segregated strata.

The first of these strata is a commingled intermetallic compound phase 45 that develops adjacent to interface 42 in pillar 22 and that is comprised of tin (Sn) distributed through copper (Cu). Unfortunately, commingled intermetallic compound phase 45 is undesirably brittle and undesirably resistant to the transmission of electrical current $I_{20}$.

A second stratum of an objectionable intermetallic compound phase that also arises in bump contact 20 from use. Thus depicted is an evacuated intermetallic compound phase 46 that is develops adjacent to interface 42 in reflowed solder crown 28. Evacuated intermetallic compound phase 46 encompasses a plurality of fine voids 48. Voids 48 arise when tin (Sn) in commingled intermetallic compound phase 43 in reflowed solder crown 28 diffuses on an extended basis across interface 42 into pillar 22. Evacuated intermetallic compound phase 46 develops subsequently to the establishment of commingled intermetallic compound phase 45 in pillar 22 due to induced diffusion $ID_{Sn}$ of tin (Sn) out of commingled intermetallic compound phase 43

The presence of voids 48 in evacuated intermetallic compound phase 46 impairs the reliability of bump contact 20 in two ways. First, voids 48 render evacuated intermetallic compound phase 46 mechanically brittle. Second, voids 48 physically diminish the electrically-conductive cross-sectional area of bump contact 20 at interface 42. This increases electrical resistance and, correspondingly, accelerates the rate of heating in the material matrix of bump contact 20 that is associated with the transmission of electrical current $I_{20}$.

According to one aspect of the present invention, a bump contact, such as bump contact 20 illustrated in FIGS. 3A and 3B, is provided with stabilization means for retarding the formation of a brittle intermetallic compound phase in the vicinity of interface 42 during operation of the semiconductor package in which bump contact 20 is employed. The structure performing this function is located between second end 26 of pillar 22 and first end 38 of reflowed solder crown 28 and is disposed there when bump contact 20 is being manufactured.

By way of example, one form of a stabilization means according to teachings of the present invention takes the form of a barrier to the electro-migration into first end 38 of reflowed solder crown 28 of a selected chemical constituent of pillar 22. Most commonly that selected chemical constituent of pillar 22 is copper (Cu), or occasionally gold (Au). According to the present invention, the barrier is a control layer of material interposed between second end 26 of pillar 22 and first end 38 of reflowed solder crown 28. The material of the barrier is chosen from the group consisting of nickel (Ni), palladium (Pd), tantalum nitride (TaN), alloys of titanium-tungsten (Ti—W), and alloys of nickel-vanadium (Ni—V). The thickness of the control layer is not substantial, preferably in a range of from about 5 microns to about 10 microns.

An exemplary first method by which such a control layer can be manufactured in a bump contact, such as bump contact 20, and then used in effecting an electrical connection between a support substrate and a semiconductor device mounted on the support substrate, will be described by reference to the ordered sequence of schematic elevation views presented in FIGS. 4A-4J.

In FIG. 4A, a semiconductor device 50 is shown, and electrical access surface 52 thereof is identified. On electrical access surface 52 rests a contact pad 54 that communicates electrically in manners not illustrated with appropriate structures in semiconductor device 50. To commence making an electrical connection between contact pad 54 and a support substrate to which semiconductor device 50 is to be mounted, electrical access surface 52 and contact pad 54 are covered with a photoresist layer 56. As illustrated in FIG. 4B, a well 58 is formed through photoresist layer 56 to contact pad 54.

In FIG. 4C construction commences of a bump contact that is electrically and mechanically attached to contact pad 54.

The bottom of well 58 is filled with a material, such as copper (Cu) or gold (Au), to produce an upstanding pillar 60 on contact pad 54. Pillar 60 as a result has an exposed end surface 61 that is accessible by way of well 58.

Then, as shown in FIG. 4D, a control layer 62 is applied through well 58 to exposed end surface 61 of pillar 60. This is accomplished by way of example and not limitation using a method selected from the group consisting of electrolytic plating, electroless plating, and vapor deposition. Control layer 62 is made from a material capable of resisting the electro-migration of one or more selected chemical constituents out of pillar 60 into the portions of the bump contact being manufactured in well 58 and that are to be added to the bump contact in subsequent steps of manufacturing. By way of example and not limitation, control layer 62 is intended to resist the electro-migration of copper (Cu) out of pillar 60. Correspondingly then, by way of example and not limitation, the material of control layer 62 is chosen from the group consisting of nickel (Ni), palladium (Pd), tantalum nitride (TaN), alloys of titanium-tungsten (Ti—W), and alloys of nickel-vanadium (Ni—V).

The thickness $T_{62}$ of control layer 62 must be sufficient to achieve the intended purpose thereof. By way of example, therefore, thickness $T_{62}$ of control layer 62 ranges from as little as about 2 microns to as much as about 20 microns. A greater thickness $T_{62}$ in control layer 62 would not necessarily derogate from the intended function of control layer 62, but might be undesirable for reasons related to manufacturing methodology or to the architecture of the semiconductor package being constructed. Alternatively, by way of example, the thickness $T_{62}$ of control layer 62 ranges from about 3.5 microns to about 15 microns, or more narrowly from about 5 microns to about 10 microns.

Then as shown in FIG. 4E, a reflowable solder crown 64 is installed on control layer 62 using solder plating techniques. Other techniques of installation are acceptable, and an additional such technique will be illustrated subsequently. Typically, the solder from which reflowable solder crown 64 is made is a fusible tin-based alloy comprised primarily of tin (Sn) and lead (Pb) in combination with various other metallic elements, such as antimony (Sb), bismuth (Bi), and silver (Ag). Lead-free solder compositions exist and are acceptable for use in forming reflowable solder crown 64. In these, tin (Sn) predominates in combination with various traces of, for example, antimony (Sb), bismuth (Bi), copper (Cu), silver (Ag), and others. The collective assemblage of pillar 60, control layer 62, and reflowable solder crown 64 will be referred to hereinafter as a bump contact 66, notwithstanding that further modifications to the structure of bump contact 66 will be implemented before bump contact 66 is actually used in electrically connecting semiconductor device 50 to a support substrate.

As shown in FIG. 4F, all remaining portions of photoresist layer 56 are removed from electrical access surface 52 of semiconductor device 50, leaving bump contact 66 as a free-standing structure that projects from semiconductor device 50 substantially normal to electrical access surface 52 thereof. Optionally, but as illustrated in FIG. 4G, the entirety of semiconductor device 50, including in particular bump contact 66, is warmed by ambient heating sufficiently to soften the solder of reflowable solder crown 64 and allow reflowable solder crown 64 to reform into a rounded reflowable solder crown 68.

FIG. 4H depicts a support substrate 72 to which semiconductor device 50 from FIG. 4G is to be mounted and electrically connected. Engagement surface 74 of support substrate 72 is also identified. Engagement surface 74 carries a conductor 76, which is surmounted by a flux coating 78. Conductor 76 communicates electrically in manners not illustrated with appropriate structures in support substrate 72. Semiconductor device 50 is positioned in proximity to support substrate 72 with bump contact 20 between semiconductor device 50 and support substrate 72 and with rounded reflowable solder crown 68 contacting conductor 76 on support substrate 72.

As shown in FIG. 4I, the entire assemblage of support substrate 72 and semiconductor device 50 is warmed sufficiently to soften the solder of rounded reflowable solder crown 68 and allow rounded reflowable solder crown 68 to achieve a reflow attachment electrically and mechanically on behalf of bump contact 20 with conductor 76 on support substrate 72. As thusly reconfigured the solder assumes the form of reflowed solder crown 70.

Finally, as shown in FIG. 4J, adhesive fill 82 is used to pack the space not occupied by bump contact 66 between electrical access surface 52 of semiconductor device 50 and engagement surface 74 of semiconductor device 72. A completed semiconductor package 84 results.

A second exemplary method for effecting an electrical connection between a support substrate and a semiconductor device mounted on the support substrate is illustrate in the ordered sequence of schematic elevation views presented in FIGS. 5A-5E. The second method uses solder ball attachment to install a reflowable solder crown on a control layer, such as control layer 62 created in the first method. To the extent practicable, reference characters from that first method will be employed to identify identical or substantially identical structures appearing in the second method depicted in FIGS. 5A-5E.

Shown in FIG. 5A is semiconductor device 50 and contact pad 54 upon which some initial portions of a bump contact have been constructed. These initial portions of a bump contact include pillar 60 and control layer 62 disposed thereon. In contrast to FIG. 4C in the first method disclosed earlier, an exposed surface 96 of control layer 62 is flush with the top surface of photoresist layer 56.

Figure 5B:
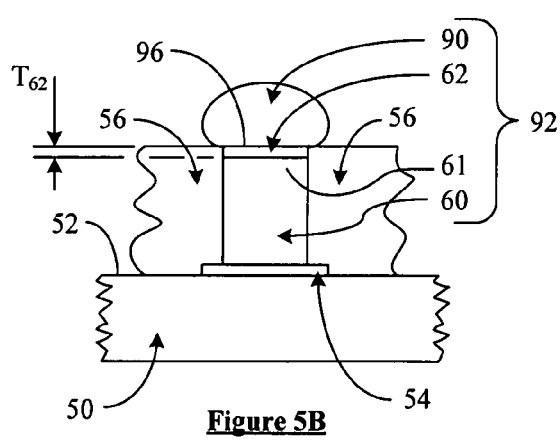
Figure 5C:
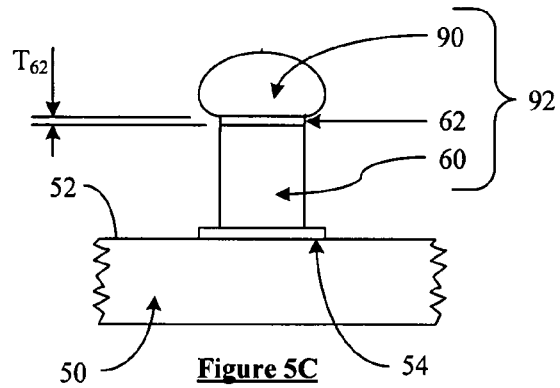

As shown in FIG. 5B, a rounded solder ball 90 is installed on exposed surface 96 of control layer 62, completing a bump contact 92. Photoresist layer 56 is removed as shown in FIG. 5C. Thereupon, as shown in FIG. 5D, semiconductor device 50 is positioned in proximity to support substrate 72 with bump contact 92 between semiconductor device 50 and support substrate 72 and with solder ball 90 contacting conductor 76 on support substrate 72.

Figure 5D:
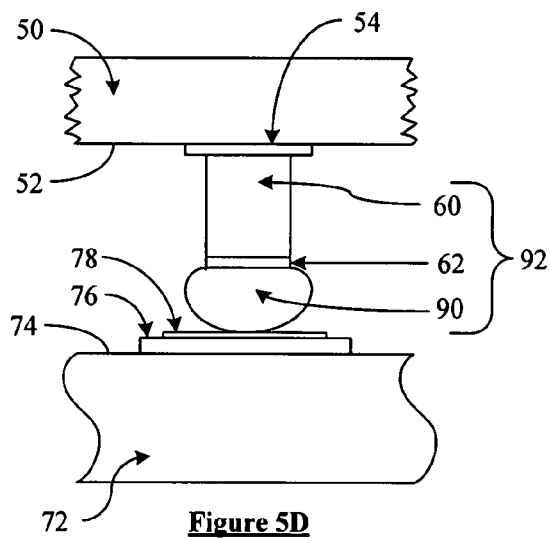
Figure 5E:
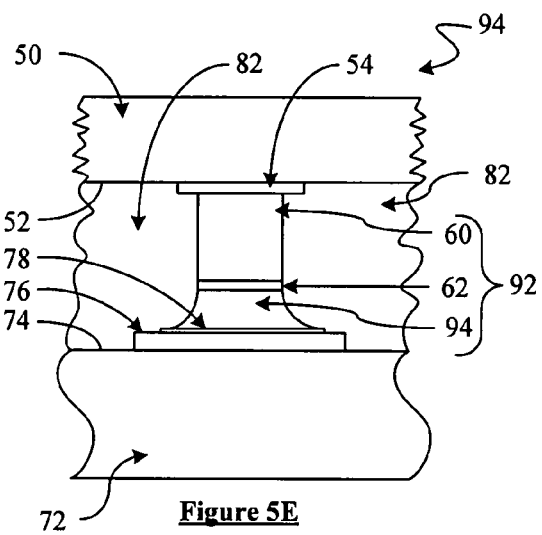

The entirety of the assembly of support substrate 72 and semiconductor device 50 shown in FIG. 5D is warmed sufficiently to soften the solder of solder ball 90 and allow solder ball 90 to achieve a reflow attachment electrically and mechanically on behalf of bump contact 92 with conductor 76 on support substrate 72. As thusly reconfigured the solder assumes the form of a reflowed solder crown 94 shown in FIG. 5E. Adhesive fill 82 is used to pack the space not occupied by bump contact 92 between electrical access surface 52 of semiconductor device 50 and engagement surface 74 of support substrate 72. A completed semiconductor package 94 results.

Figure 6A:
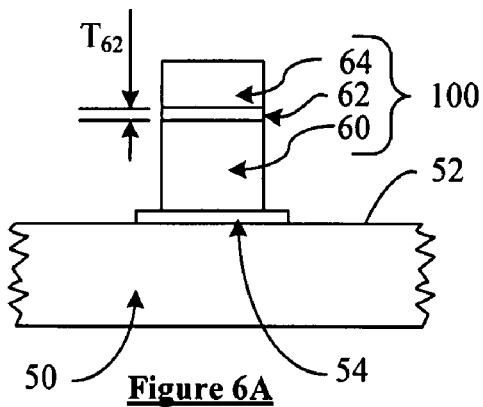
FIGS. 6A-6C are an ordered sequence of schematic elevation views of steps in a third method using teachings of the present invention to effect an electrical connection between a conductor on a support substrate and a contact pad on a semiconductor device mounted on the support substrate.
Figure 6B:
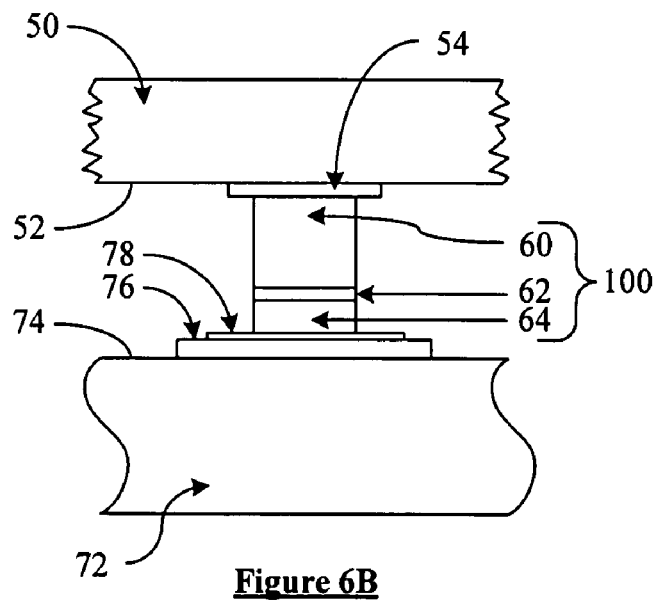
Figure 6C:
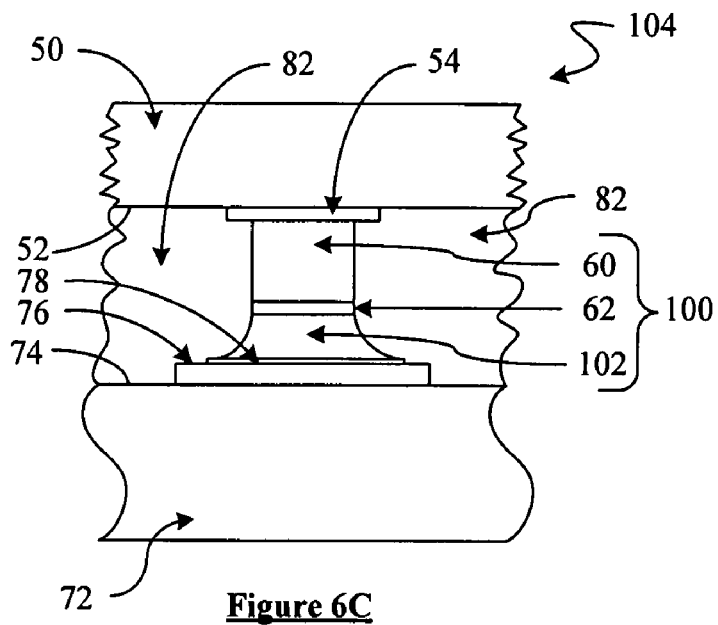

A third exemplary method for effecting an electrical connection between a support substrate and a semiconductor device mounted on the support substrate is illustrate in the ordered sequence of schematic elevation views presented in FIGS. 6A-6C. On a control layer, such as control layer 62 created in the first method discussed above, the third method uses a reflowable solder crown that exhibits no rounding whatsoever. To the extent practicable, reference characters from that first method will be employed to identify identical or substantially identical structures appearing in the third method depicted in FIGS. 6A-6C.

Shown in FIG. 6A is semiconductor device 50 and contact pad 54 upon which all portions of a bump contact 100 have been constructed. These portions include pillar 60, reflowable solder crown 64, and control layer 62 sandwiched therebetween.

As shown in FIG. 6B, without further processing of the type depicted in FIG. 4G of the first method, semiconductor device 50 is positioned in proximity to support substrate 72 with bump contact 100 between semiconductor device 50 and support substrate 72 and with reflowable solder crown 64 contacting conductor 76 on support substrate 72.

The entirety of the assemblage of support substrate 72 and semiconductor device 50 shown in FIG. 6B is warmed sufficiently to soften the solder of reflowable solder crown 64 and allow reflowable solder crown 64 to achieve a reflow attachment electrically and mechanically on behalf of bump contact 100 with conductor 76 on support substrate 72. As thusly reconfigured the solder assumes the form of a reflowed solder crown 102 shown in FIG. 6C. Adhesive fill 82 is used to pack the space not occupied by bump contact 100 between electrical access surface 52 of semiconductor device 50 and engagement surface 74 of support substrate 72. A completed semiconductor package 104 results.

Figure 7A:
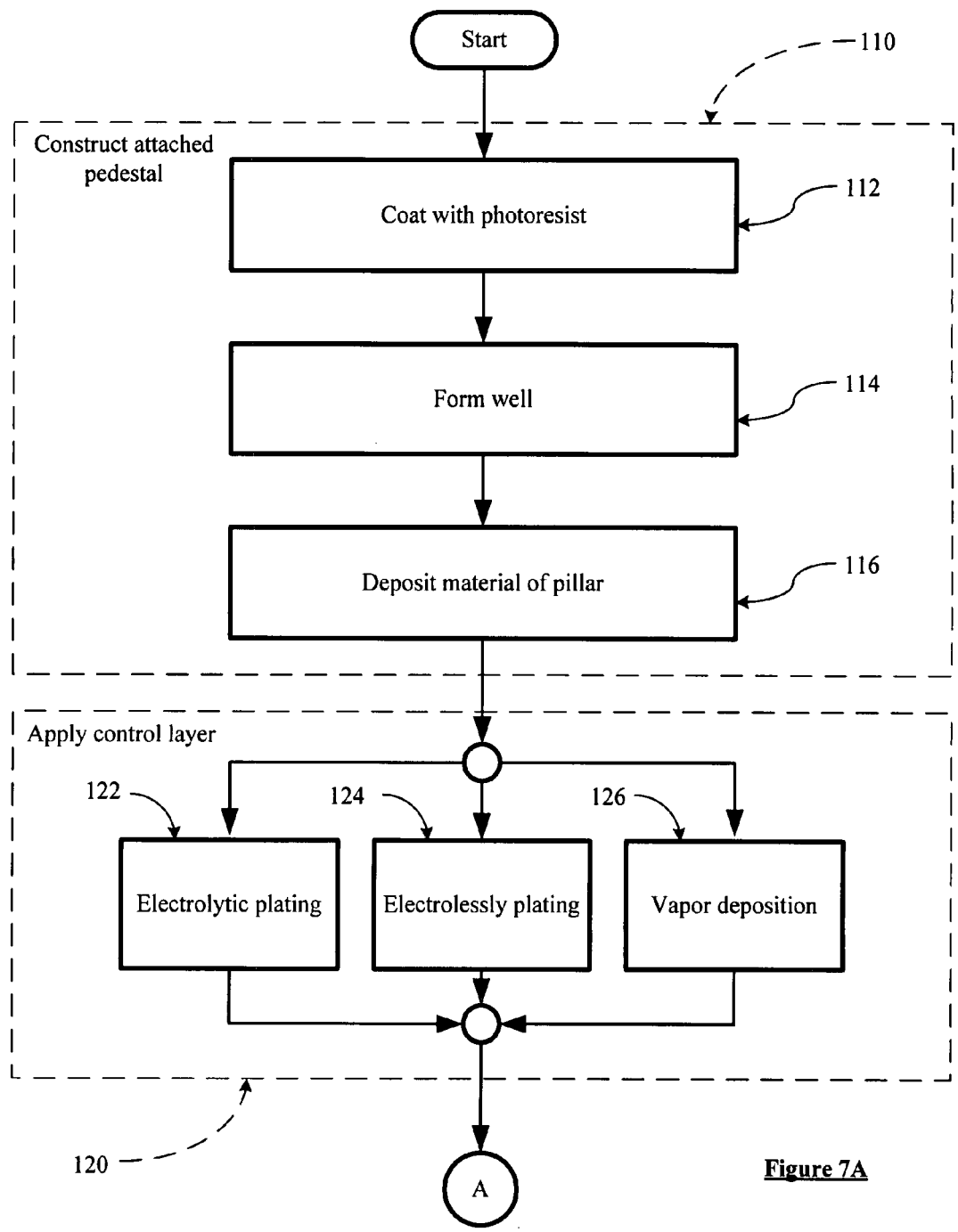
FIGS. 7A and 7B together present a single, comprehensive flow chart of steps in methods of manufacture illustrated, respectively in FIGS. 4A-4J, in FIGS. 5A-5E, and in FIGS. 6A-6C.
Figure 7B:
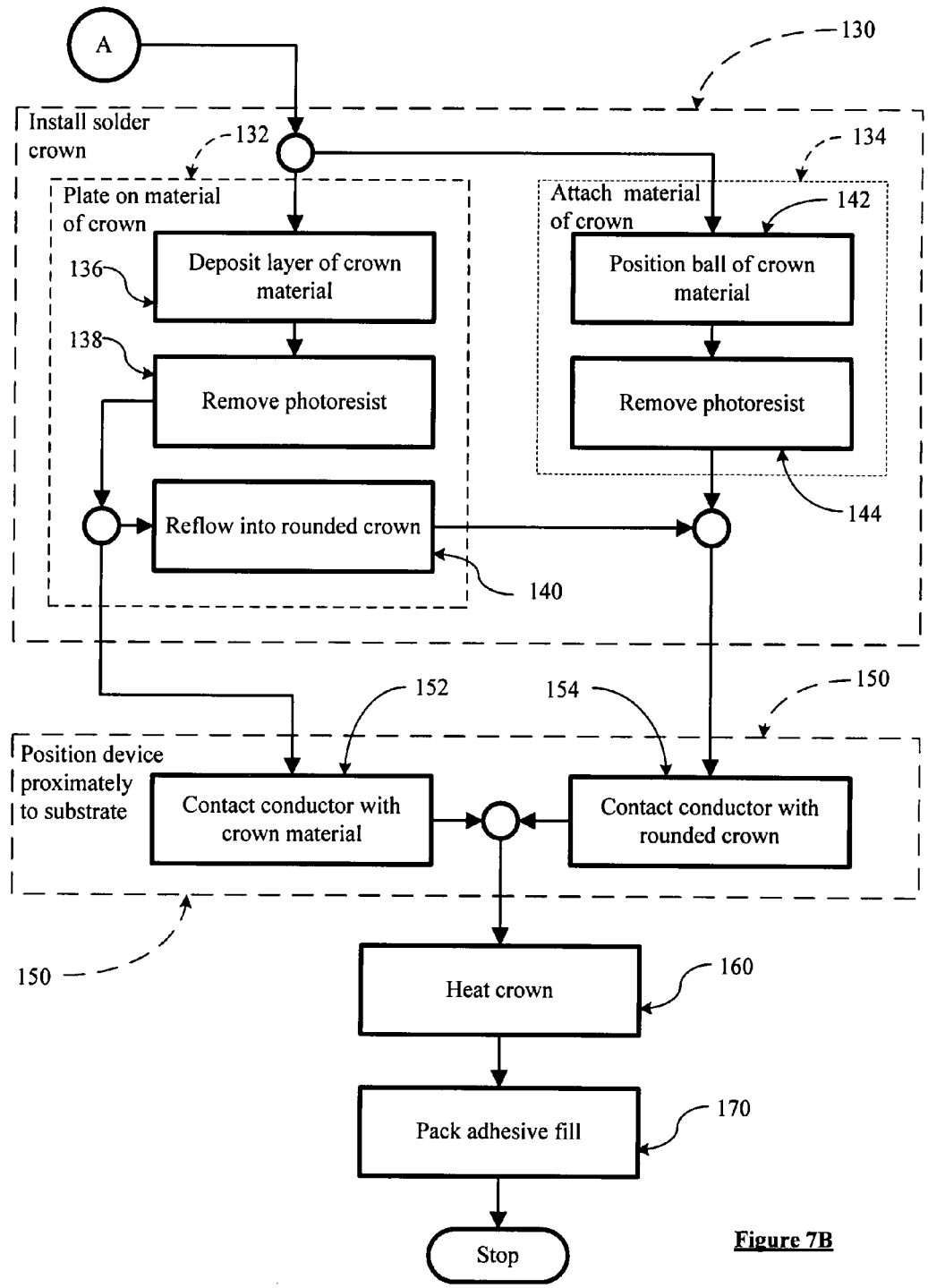

FIGS. 7A and 7B together present a single, comprehensive flow chart of steps in the first method of manufacture illustrated in FIGS. 4A-4J, in the second method of manufacture illustrated in FIGS. 5A-5E, and in the third method of manufacture illustrated in FIGS. 6A-6C.

In FIG. 7A all of the methods commence with a shared set of steps that are grouped conceptually in a dashed subroutine rectangle 110. The overall result of performing the steps included in subroutine rectangle 110 is the construction of an electrically conductive pillar having first and second extreme ends, as well as the attachment of the first end of the pillar electrically and mechanically to a contact pad on a semiconductor device. In particular, those steps commence, as indicated in process rectangle 112, by coating the contact pad and the surface of the semiconductor device carrying the contact pad with a photoresist layer. Then as indicated in process rectangle 114, a well is formed in the photoresist layer at the contact pad. Finally, as indicated in process rectangle 116, a material, such as copper (Cu) or gold (Au), from which to form the pillar of a bump contact is deposited in the bottom of the well.

In dashed subroutine rectangle 120, one of several alternative steps is then undertaken. The result of performing any of the alternative steps within subroutine rectangle 120 is to apply to the second end of the pillar an electrically conductive control layer that is comprised of a material capable of resisting the electro-migration of copper (Cu) out of the second end of the pillar and into the reflowable solder crown. This overall objective is accomplished, either by electrolytic plating that material as indicated in process rectangle 122, by electroless plating that material as indicated in process rectangle 124, or by using vapor deposition of that material as called for in process rectangle 126.

Then in FIG. 7B, the methods resume in a dashed subroutine rectangle 130, which encompasses a pair of alternative sub-subroutines, each including a plurality of method steps. In one of the sub-subroutines one of the method steps is optional. The overall result of performing either of the sub-subroutines within subroutine rectangle 130 is the installation of a reflowable solder crown on the control layer that was applied earlier to the second end of the pillar. This overall objective is accomplished, either by plating the material of the crown on the control layer as set forth in finely-dashed sub-subroutine rectangle 132, or by attaching the material of the crown on the control layer as set forth in finely-dashed sub-subroutine rectangle 134.

In the plating option of sub-subroutine rectangle 132, method steps commence as indicted in process rectangle 136 by depositing a layer of the crown material on the control layer that was applied earlier to the second end of the pillar. Then as indicated in process rectangle 138, the photoresist layer is removed from the contact pad and the surface of the semiconductor device carrying the contact pad. Finally, the assembly is heated to permit the layer of crown material to reflow into a rounded crown, as set forth in process rectangle 140. The method step of process rectangle 140 is optional, however, as the remainder of the depicted method steps can be successfully preformed using a layer of crown material that is not rounded.

In the attaching option of sub-subroutine rectangle 134, method steps commence as indicted in process rectangle 142 by positioning a ball of crown material on the control layer that was applied earlier to the second end of the pillar. Then as indicated in process rectangle 144, the photoresist layer is removed from the contact pad and the surface of the semiconductor device carrying the contact pad.

Once a reflowable solder crown is installed on the control layer, as required in subroutine rectangle 130, the depicted methods resume in a dashed subroutine rectangle 150, which encompasses a pair of alternative method steps. The alternative method step to be employed is determined according to whether or not a rounded crown was produced in the preceding method steps actually undertaken. The result of performing either of the alternative method steps within subroutine rectangle 150 is to position the semiconductor device in proximity to the support substrate with the pillar between the semiconductor device and the support substrate and with the crown material contacting the conductor on the support substrate. If the crown produced in the preceding method steps is not rounded, then as indicated in process rectangle 152, the conductor is contacted by that layer of crown material. On the other hand, if the crown produced in the preceding method steps is rounded, then as indicated in process rectangle 154, the conductor is instead contacted by that rounded crown material.

In FIG. 7B, all of the depicted methods conclude with a shared set of steps that are performed in sequence. First, as indicated in process rectangle 160, the assembly of the semiconductor device and the support substrate with the pillar therebetween is heated sufficiently for the crown to make a reflow attachment on behalf of the bump contact electrically and mechanically with the conductor on the support substrate. Then, as indicated in process rectangle 170, adhesive filler is applied to pack the space not occupied by the bump contact between the semiconductor device and the support substrate. A completed semiconductor package results that embodies teachings of the present invention.

Figure 8:
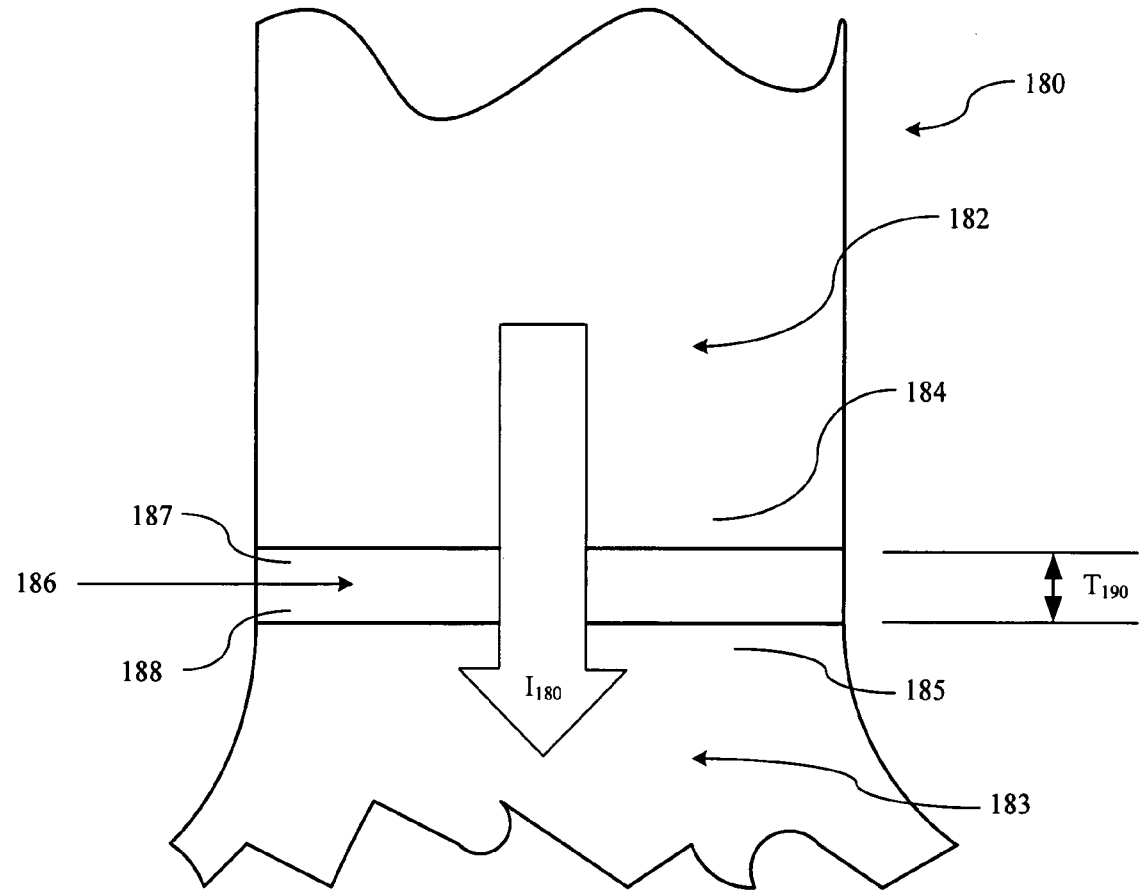
FIG. 8 is a highly enlarged diagrammatic depiction of the interface between the materially-contrasting pair of major components of a bump contact embodying teachings of the present invention.

FIG. 8 is a highly enlarged diagrammatic depiction of the interface region between a materially-contrasting pair of major components in a bump contact that embodies teachings of the present invention. Thus shown is a portion of a bump contact 180 located at and between an electrically conductive pillar 182 constructed by way of example from copper (Cu) or gold (Au), and a reflowed solder crown 183 constructed of a solder alloy containing tin (Sn). The end of pillar 182 not shown in FIG. 8 effects an electrical contact and a mechanical attachment on behalf of one end of pillar 182 to a semiconductor device, which also does not appear in FIG. 8. Similarly, the end of reflowed solder crown 183 not shown in FIG. 8 effects an electrical contact and a mechanical attachment on behalf of the opposite end of pillar 182 to a support substrate, which is also missing in FIG. 8.

Located between the end 182 of pillar 182 that does appear in FIG. 8 and the end 185 of reflowed solder crown 183 that does appear in FIG. 8 is a control layer 186 manufactured and configured according to teachings of the present invention. Control layer 186 serves as a barrier to retard the diffusion of copper (Cu) from pillar 182 into reflowed solder crown 183. In this manner, control layer 186, stabilizes the structural and electrical properties of bump contact 180, notwithstanding the use of bump contact 180 to transmit electrical current $I_{180}$, which is represented in FIG. 8 by an arrow. Therefore, control layer 186 is constructed from a material chosen from the group consisting of nickel (Ni), palladium (Pd), tantalum nitride (TaN), alloys of titanium-tungsten (Ti—W), and alloys of nickel-vanadium (Ni—V). Control layer 186 has a thickness $T_{186}$ that ranges from about 5 microns to about 10 microns.

Though relatively thin, control layer 186 necessarily has a first side 187 that is secured to end 182 of pillar 182 and a second side 188 that is secured to end 185 of reflowed solder crown 183. During the transmission through bump contact 180 of electrical current $I_{180}$, the presence of control layer 186 between pillar 182 and reflowed solder crown 183 retards the migration displacement of copper (Cu) away from the original manufactured location thereof in pillar 182 and into end 185 of reflowed solder crown 183. In this manner the formation is resisted within the material matrix of bump contact 180 of the undesirable intermetallic compound phases depicted, for example in FIG. 3B. Thus, no commingled intermetallic compound phase comprised of tin (Sn) distributed through copper (Cu) develops in pillar 182, and no evacuated intermetallic compound phase containing voids develops in reflowed solder crown 183.

The remaining figures are photomicrographs of actual bump contacts extracted from assembled semiconductor packages and acquired after dissection using a scanning electron microscope.

Figure 9A:
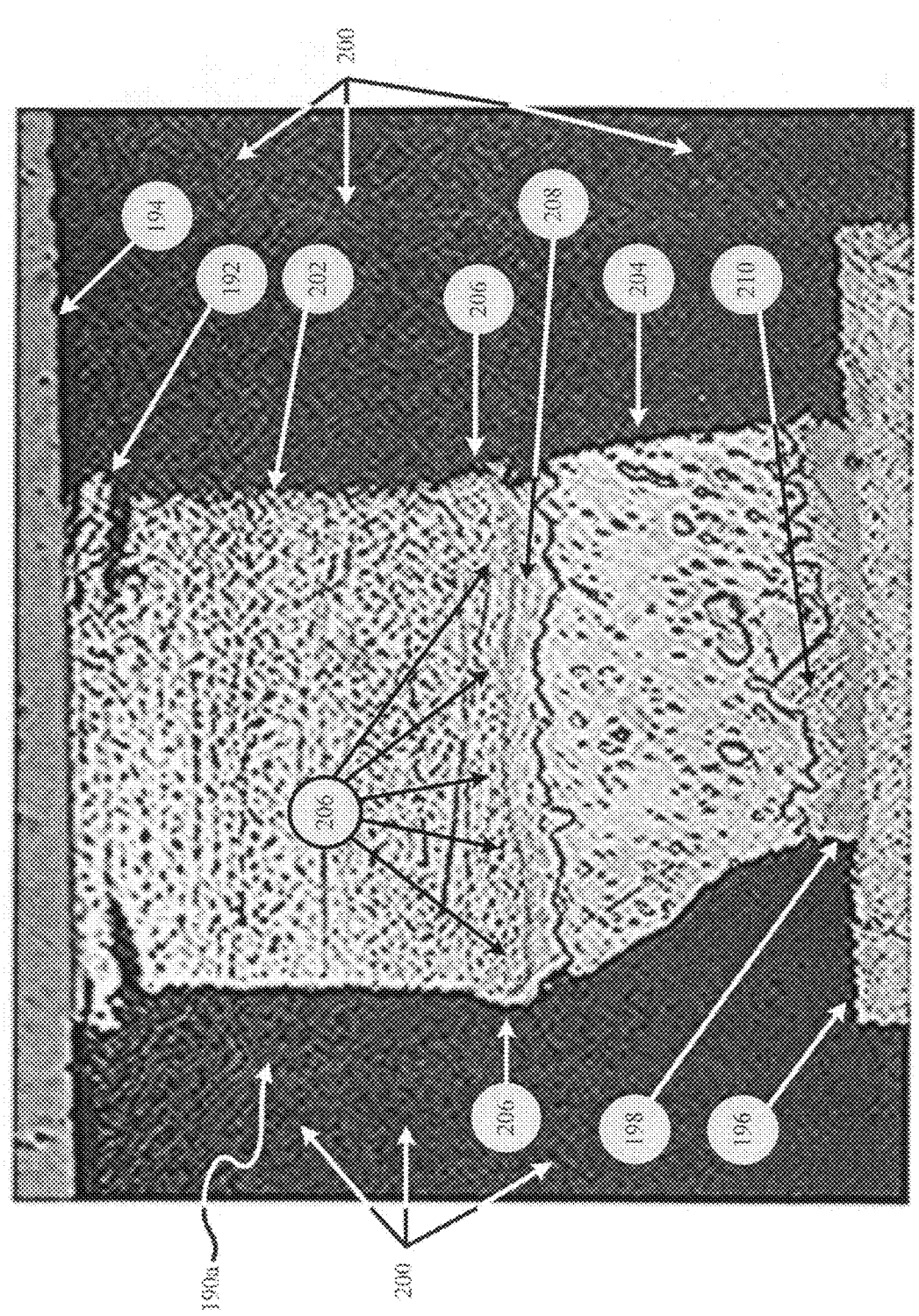
FIGS. 9A and 9B are photomicrographs of bump contacts manufactured without benefit of teachings of the present invention that together offer an understanding of the material and structural alterations produced by electrical current in such bump contacts, FIG. 9A being a photomicrograph of a newly-manufactured bump contact not embodying teachings of the present invention, and FIG. 9B being a photomicrograph of such a bump contact following a predetermined period of use.
Figure 9B:
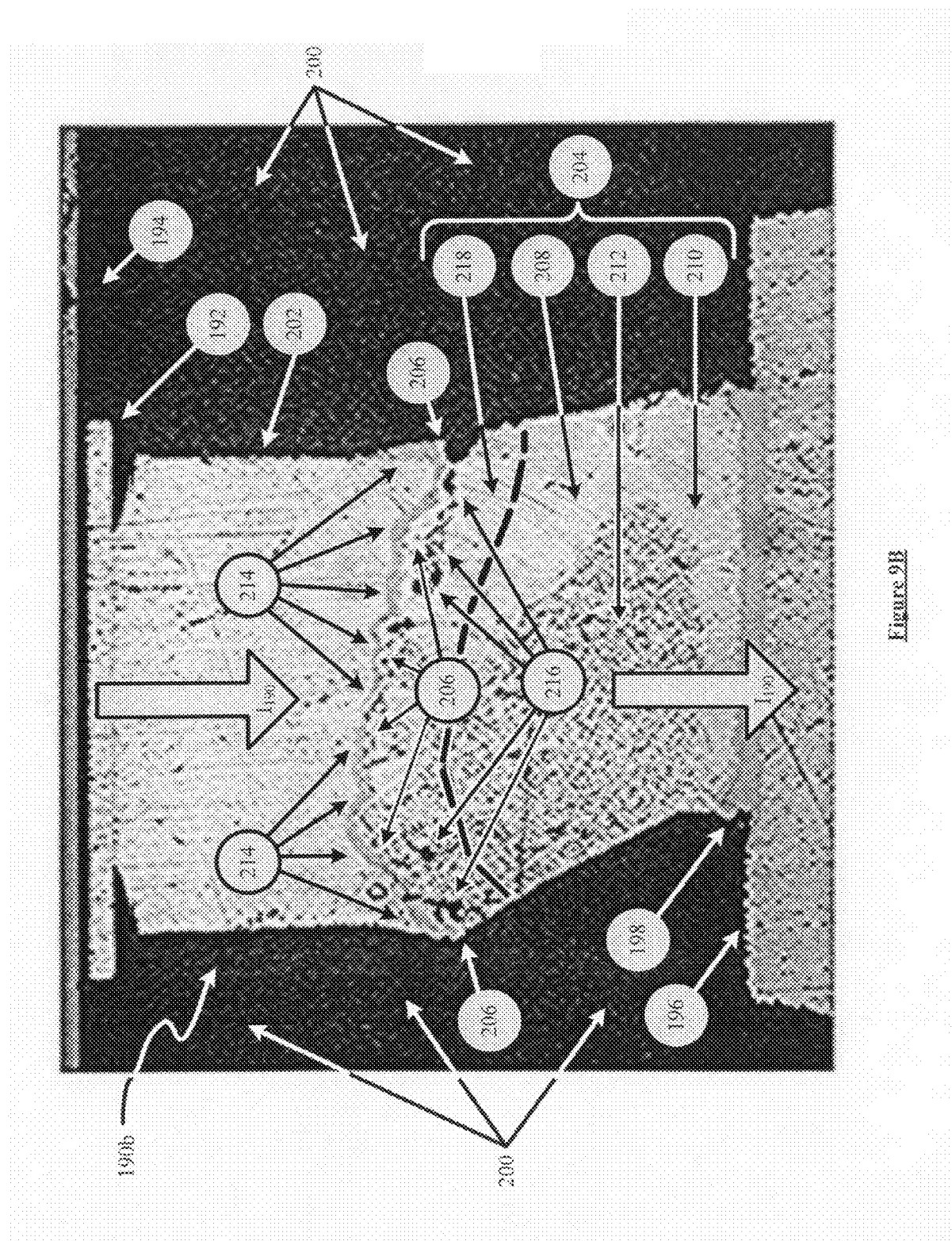

FIGS. 9A and 9B are photomicrographs of bump contacts manufactured without benefit of teachings of the present invention. Taken together FIGS. 9A and 9B afford a visual understanding inter alia of the undesirable material and structural alterations produced by electrical current in such bump contacts.

Figure 10A:
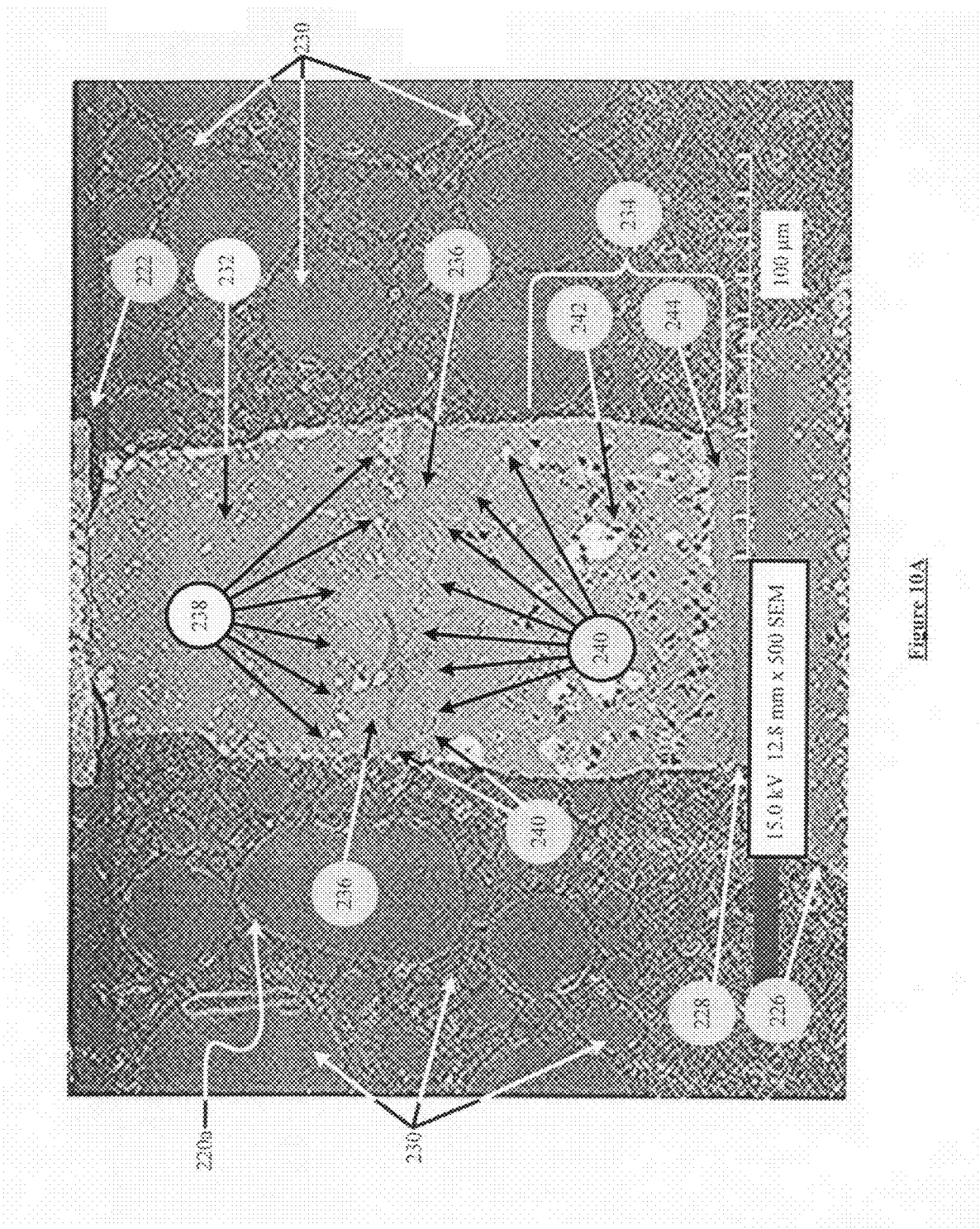
FIGS. 10A and 10B are photomicrographs of bump contacts manufactured according to teachings of the present invention that together, and by comparison with FIGS. 9A and 9B, offer an understanding of the beneficial reduction occasioned by the present invention in the material and structural alterations caused in such bump contacts by electrical current, FIG. 10A being a photomicrograph of a newly-manufactured bump contact embodying teachings of the present invention, and FIG. 10B being a photomicrograph of such a bump contact following a predetermined period of use.
Figure 10B:
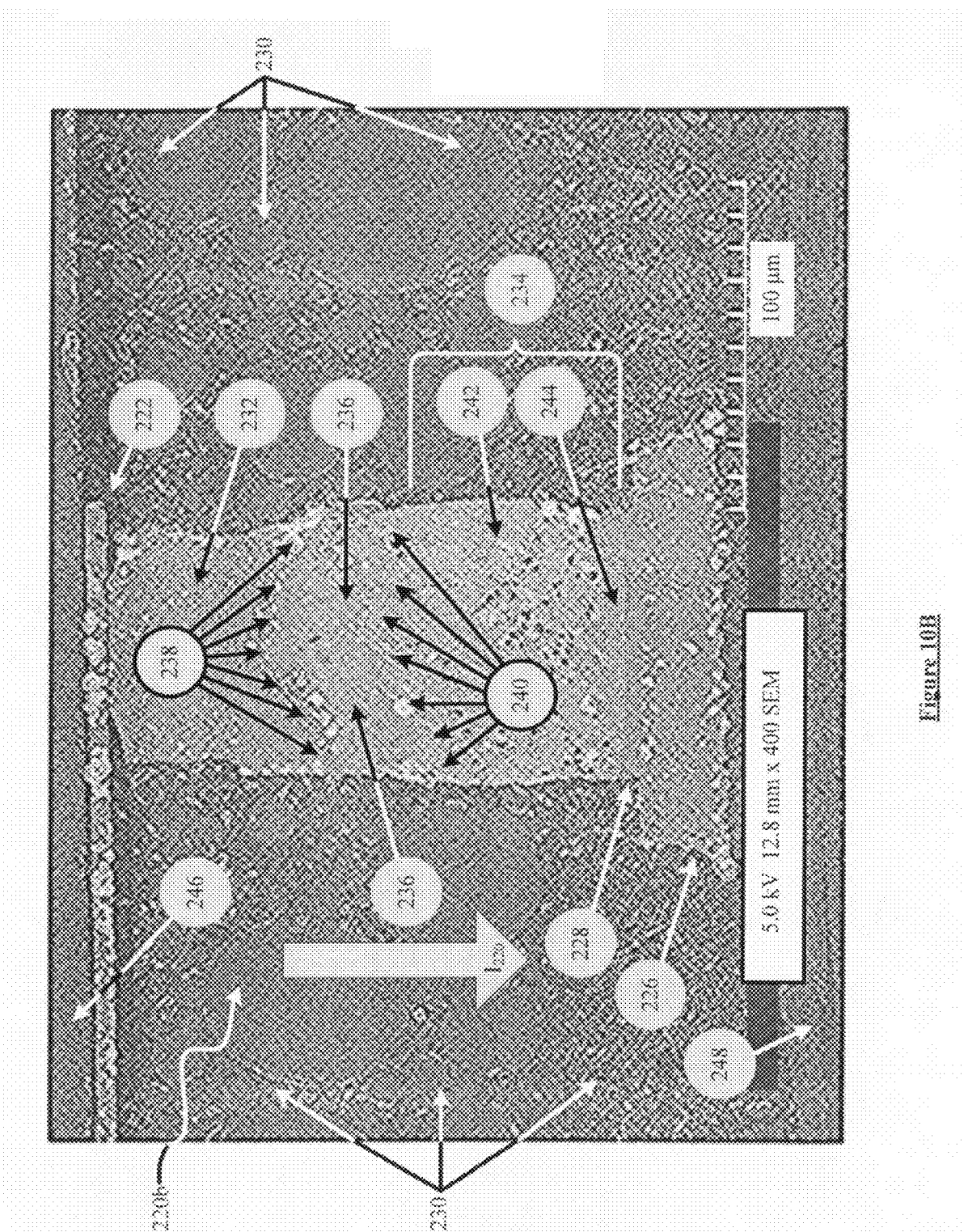
Figure 11:
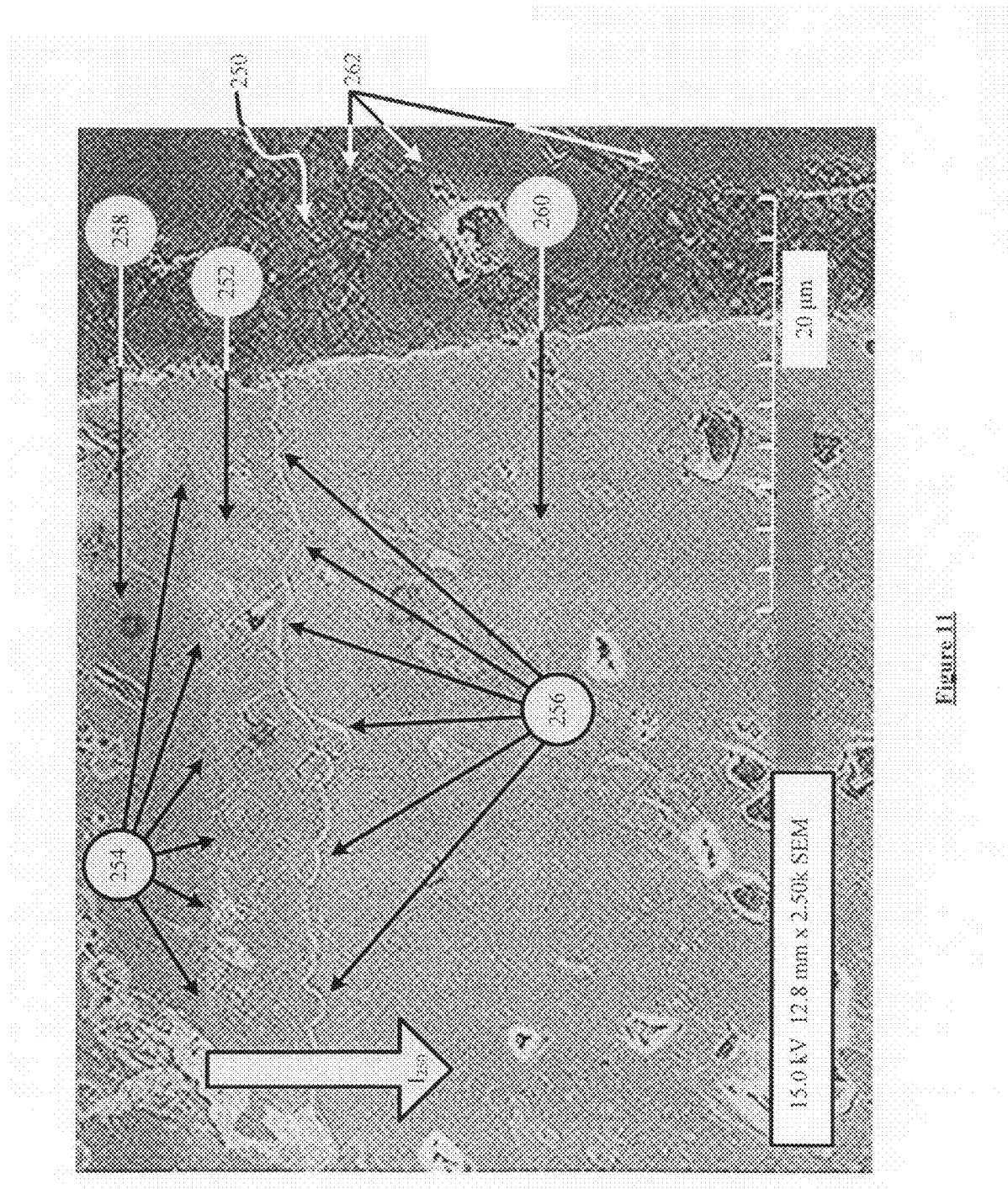
FIG. 11 is highly enlarged photomicrograph of a control layer embodying the inventive technology interposed between the materially-contrasting pair of major components of a bump contact following a predetermined period of use.

FIGS. 10A and 10B are photomicrographs of bump contacts manufactured and configured according to teachings of the present invention. Taken together FIGS. 9A and 9B, afford a visual understanding of the dramatic reduction occasioned by the present invention in the undesirable material and structural alterations caused by electrical current in such bump contacts. FIG. 11 is a highly-enlarged view of a portion of another bump contact embodying the present invention after sustained use.

FIG. 9A depicts an unused, newly-manufactured bump contact 190a that does not embody teachings of the present invention. Bump contact 190a connects a contact pad 192 on a semiconductor device 194 with a conductor 196 on a support substrate that is not included in FIG. 9A. Conductor 196 is surmounted by a flux coating 198. The space not occupied by bump contact 190a between semiconductor device 194 and the support substrate that carries conductor 196 is packed by an adhesive fill 200.

Bump contact 190a includes a pair of materially-contrasting major components: an electrically conductive pillar 202 made of copper (Cu); and a reflowed solder crown 204 made of a lead-free solder alloy containing primarily tin (Sn) and silver (Ag). By way of perspective, pillar 202 has a diameter measured across bump contact 190a between regions of adhesive fill 200 that is equal to about 120 microns. The height of pillar 202 measured in alignment with bump contact 190a from contact pad 192 to reflowed solder crown 204 is equal to about 80 microns.

The abutment of pillar 202 against reflowed solder crown 204 defines an interface 206 therebetween that is repeatedly identified in FIG. 9A. A pair of irregular, dark lines are shown extending across reflowed solder crown 204 between regions of adhesive fill 200 to either side thereof in FIG. 9A. These are each a margin of a respective commingled intermetallic compound phase that was produced inadvertently within the material matrix of reflowed solder crown 204 during, respectively, the manufacture of bump contact 190a and the attachment of bump contact 190a to conductor 196.

The first of these is a commingled intermetallic compound phase 208 that developed in reflowed solder crown 204 adjacent to interface 206. Commingled intermetallic compound phase 208 is composed of copper (Cu) from pillar 202 that is distributed through the metallic elements in the solder of reflowed solder crown 204. That copper (Cu) diffused into reflowed solder crown 204 due to the heat imposed at interface 206, when the antecedent solder material of reflowed solder crown 204 is applied to pillar 202 during the manufacture of bump contact 190a as a structure secured to semiconductor device 194. Commingled intermetallic compound phase 208 causes no significant adverse changes in the mechanical brittleness or in the electrical resistance of bump contact 190a.

The other commingled intermetallic compound phase is a commingled intermetallic compound phase 210 that developed in reflowed solder crown 204 adjacent to flux coating 198 on conductor 196. Commingled intermetallic compound phase 210 is composed of copper (Cu) from conductor 196 and tin (Sn) from flux coating 198 that are distributed through the metallic elements in the solder of reflowed solder crown 204. That copper (Cu) and that tin (Sn) diffused into reflowed solder crown 204 due to the heat imposed on conductor 196 and on flux coating 198, when the antecedent solder material of reflowed solder crown 204 was warmed sufficiently to enable the reflow attachment of bump contact 190a to conductor 196. Commingled intermetallic compound phase 210 causes no significant adverse changes in the mechanical brittleness or in the electrical resistance of bump contact 190a.

FIG. 9B depicts a bump contact 190b that, like bump contact 190a in FIG. 9A, does not embody teachings of the present invention. Bump contact 190b and bump contact 190a are not actually a single bump contact, but both were manufactured to the same specification using the same materials in substantially identical manufacturing processes. Therefore, for the purpose of any practical comparisons, bump contact 190b and bump contact 190a are structurally identical. To the extent practicable, identical reference characters will be employed to identify corresponding structures in bump contact 190b and in bump contact 190a.

Unlike bump contact 190a, however, bump contact 190b is neither newly-manufactured nor unused. Instead, bump contact 190b was subjected for approximately 800 hours to the transmission therethrough of an electrical current $I_{190}$ equal to about 0.5 amperes.

The use of bump contact 190b in this way produced many changes in the material structure thereof. A few of these changes, which are relatively benign to the overall material and electrical reliability of bump contact 190b, will be discussed by giving initial attention to the contrast in appearance between reflowed solder crown 204 in bump contact 190b in FIG. 9B and reflowed solder crown 204 in unused bump contact 190a in FIG. 9A.

For example, in bump contact 190b commingled intermetallic compound phase 208 is enlarged substantially, having extending itself from interface 206 far into reflowed solder crown 204. Commingled intermetallic compound phase 210 also grew in extent, but less dramatically, advancing somewhat into reflowed solder crown 204 from conductor 196. The expansion of each was, however, faster toward the right edge of reflowed solder crown 204 than toward the left. In addition, the relatively uniform intermixture of tin (Sn) and silver (Ag) exhibited in reflowed solder crown 204 of bump contact 190a in FIG. 9A was disrupted in localized regions by the diffusion of silver (Ag) away into other areas. Thus, a virtually pure region 212 of tin (Sn) developed on the left edge and in the center of reflowed solder crown 204. The presence and the growth of pure region 212 and commingled intermetallic compound phases 208, 210 did not, however, lead to significant undesirable changes in mechanical brittleness or electrical resistance.

On the other hand, further comparison of bump contact 190b in FIG. 9B to bump contact 190a in FIG. 9A does reveal additional material and electrical changes that are quite objectionable.

First, a commingled intermetallic compound phase 214 of substantially uniform thickness developed in pillar 202 adjacent to interface 206. Intermetallic compound phase 214 is composed of tin (Sn) distributed through copper (Cu). Commingled intermetallic compound phase 214 arose due to the transmission of electrical current $I_{190}$ across interface 206 and a resulting counter-diffusion of tin (Sn) out of commingled intermetallic compound phase 210, across interface 206, and into pillar 202. Unfortunately, commingled intermetallic compound phase 214, is undesirably brittle and undesirably resistant to the transmission of electrical current $I_{190}$.

Second, numerous fine voids 216 developed in reflowed solder crown 204 adjacent to interface 206 in commingled intermetallic compound phase 208. This had the effect of converting a portion of benign commingled intermetallic compound phase 208 into a problematic, evacuated intermetallic compound phase 218. Voids 216 arose after substantial displacement of copper (Cu) from pillar 202 into commingled intermetallic compound phase 208 saturated reflowed solder crown 204 with copper (Cu), and forced tin (Sn) from commingled intermetallic compound phase 208 to counter-diffuse into pillar 202.

Voids 216 in evacuated intermetallic compound phase 218 impair the reliability of bump contact 190b in two ways. First, voids 216 render evacuated intermetallic compound phase 218 mechanically brittle. Second, voids 216 physically diminish the electrically-conductive cross-sectional area of bump contact 190b in the vicinity of interface 206. The increased electrical resistance correspondingly accelerates the rate that bump contact 190b is heated whenever electrical current $I_{190}$ is transmitted.

FIG. 10A depicts an unused, newly-manufactured bump contact 220a that has been manufactured and is structures according to teachings of the present invention. Bump contact 220a connects a contact pad 222 on a semiconductor device with a conductor 226 on a support substrate. Neither the semiconductor device nor the support substrate is included in FIG. 10A. Conductor 226 is surmounted by a flux coating 228. The space not occupied by bump contact 220a between the semiconductor device and the support substrate is packed by an adhesive fill 230.

Bump contact 190a includes a pair of materially-contrasting major components: an electrically conductive pillar 232 made of copper (Cu); and a reflowed solder crown 234 made of a lead-free solder alloy containing primarily tin (Sn) and silver (Ag). By way of affording a perspective, a size scale using increments of 100 microns each is included on the lower right edge of FIG. 10A.

Located between pillar 232 and reflowed solder crown 234 is a control layer 236 manufactured and configured according to teachings of the present invention. Control layer 236 is constructed from nickel (Ni), thereby to serve as a barrier to retard the diffusion of copper (Cu) from pillar 232 into reflowed solder crown 234. In this manner, control layer 236, stabilizes the structural and electrical properties of bump contact 220a, notwithstanding the use of bump contact 220a to transmit electrical current. Control layer 236 has a thickness $T_{190}$ that is at least about 20 microns. Though relatively thin, control layer 236 necessarily has a first side 238 that is secured to pillar 232 and a second side 240 that is secured reflowed solder crown 234.

A commingled intermetallic compound phase was produced inadvertently within the material matrix 242 of reflowed solder crown 234 of FIG. 10A during the attachment of bump contact 220a to conductor 226.

That commingled intermetallic compound phase is a commingled intermetallic compound phase 244 that developed in material matrix 242 of reflowed solder crown 204 adjacent to flux coating 228 on conductor 226. Commingled intermetallic compound phase 244 is composed of copper (Cu) from conductor 226 and tin (Sn) from flux coating 228 that are distributed through the metallic elements in the solder of reflowed solder crown 234. That copper (Cu) and that tin (Sn) diffused into reflowed solder crown 234 due to the heat imposed on conductor 226 and on flux coating 228, when the antecedent solder material of reflowed solder crown 234 was warmed sufficiently to enable the reflow attachment of bump contact 220a to conductor 226. Commingled intermetallic compound phase 244 caused no significant adverse changes in the mechanical brittleness or in the electrical resistance of bump contact 220a.

FIG. 10B depicts a bump contact 220b electrically and mechanically interconnecting contact pad 222 on a semiconductor device 246 with conductor 226 on a support substrate 248. Like bump contact 220a in FIG. 10A, bump contact 220b embodies teachings of the present invention.

Bump contact 220b and bump contact 220a are not actually a single bump contact, but both were manufactured to the same specification using the same materials in substantially identical manufacturing processes. Therefore, for the purpose of any practical comparisons, bump contact 220b and bump contact 220a are structurally identical. To the extent practicable, identical reference characters will be employed to identify corresponding structures in bump contact 220b and in bump contact 220a.

Unlike bump contact 220a, however, bump contact 220b is neither newly-manufactured nor unused. Instead, bump contact 220b was subjected for approximately 3700 hours to the transmission therethrough of an electrical current $I_{220}$ equal to about 0.5 amperes.

The use of bump contact 220b in this way produced only slight changes in the material structure thereof. One of these changes will, however, be discussed by giving initial attention to the contrast between the appearance of material matrix 242 of reflowed solder crown 234 in bump contact 220b in FIG. 10B and the appearance of material matrix 242 of reflowed solder crown 234 in unused bump contact 220a in FIG. 10A.

For example, in bump contact 220b commingled intermetallic compound phase 244 grew in extent, advancing somewhat uniformly across bump contact 190b into material matrix 242 of reflowed solder crown 234 from conductor 226. The presence and the growth of commingled intermetallic compound phase 244 did not, however, lead to significant undesirable changes in mechanical brittleness or electrical resistance.

A further comparison of bump contact 220b in FIG. 10B to bump contact 220a in FIG. 10A does not reveal significant objectionable material or electrical changes of the types observed in bump contact 190b of FIG. 9B due to the transmission of electrical current $I_{190}$. The objectionable changes produced in bump contact 190b increased the brittleness and the electrical resistance relative to those in unused bump contact 190a. Tellingly, while electrical current $I_{190}$ transmitted through bump contact 190b and electrical current $I_{220}$ transmitted through bump contact 220b were equal in magnitude, the duration of current transmission through bump contact 220a was more than four times greater that the duration of current transmission through bump contact 190b. Still, no significant objectionable changes are detectable in bump contact 220b.

During the transmission through bump contact 220 of electrical current $I_{220}$, the presence of control layer 236 between pillar 232 and reflowed solder crown 234 retarded the electrically-induced migration displacement of copper (Cu) away from the original manufactured location thereof within pillar 232 and into reflowed solder crown 234. In this manner the formation was resisted within the material matrix of bump contact 220 of the undesirable intermetallic compound phases depicted, for example in FIG. 3B and in FIG. 9B. Thus, no commingled intermetallic compound phase comprised of tin (Sn) distributed through copper (Cu) developed in pillar 232, and no evacuated intermetallic compound phase containing voids developed in reflowed solder crown 234.

As a further confirmation of these conclusions relative to the inventive technology, FIG. 11 presents a highly enlarged photomicrograph of a portion of the right edge of a bump contact 250 that has a nickel (Ni) control layer 252 embodying the inventive technology interposed between the problematic materially-contrasting pair of major components of bump contact 250. Bump contact 250 was used for approximately 3700 hours to transmit an electrical current $I_{250}$ equal to about 0.5 amperes. By way of perspective, a size scale using increments of 20 microns each is included on the lower right edge of FIG. 11. That size scale indicates in effect that the magnification of the portion of bump contact 250 in FIG. 11 is approximately five times the magnification of bump contact 190b in FIG. 10B.

Shown as a result in FIG. 11 is a first face 254 of control layer 252. First face 254 of control layer 252 is abutted by a pillar 258 comprised of copper (Cu). The face of control layer 252 on the side of control layer 252 opposite from first face 254 is abutted by the tin (Sn) and silver (Ag) solder alloy of a reflowed solder crown 260. Also appearing is an adhesive fill 262 that surrounds bump contact 250.

A commingled intermetallic compound phase was produced inadvertently within the material matrix of reflowed solder crown 260 during the manufacture of bump contact 250. A thin commingled intermetallic compound phase 256 developed in reflowed solder crown 204 adjacent to control layer 252. Commingled intermetallic compound phase 256 is composed of nickel (Ni) from control layer 252 that is distributed through the metallic elements in the solder of reflowed solder crown 260. That nickel (Ni) diffused into reflowed solder crown 260 due to the heat imposed on control layer 252, when the antecedent solder material of reflowed solder crown 260 was applied to control layer 252 during the manufacture of bump contact 250 as a structure secured a semiconductor device. Commingled intermetallic compound phase 256 causes no significant adverse changes in the mechanical brittleness or in the electrical resistance of bump contact 250.

During the transmission through bump contact 200 of electrical current $I_{250}$, it is apparent from FIG. 11 that the presence of control layer 252 between pillar 258 and reflowed solder crown 260 retarded the electrically-induced migration displacement of copper (Cu) from pillar 258 into reflowed solder crown 260. In this manner the formation was resisted within the material matrix of bump contact 250 of the undesirable intermetallic compound phases depicted, for example in FIG. 3B and in FIG. 9B. Thus, no commingled intermetallic compound phase comprised of tin (Sn) distributed through copper (Cu) developed in pillar 258, and no evacuated intermetallic compound phase containing voids developed in reflowed solder crown 260.

The foregoing description of the invention has been described for purposes of clarity and understanding. It is not intended to limit the invention to the precise form disclosed. Various modifications may be possible within the scope and equivalence of the appended claims.

What is claimed is:

1. A bump contact for electrically connecting a conductor on a substrate and a contact pad on a semiconductor device mounted to the substrate, the bump contact comprising:
   a. an electrically conductive pillar having first and second extreme ends, the first end of the pillar being capable of effecting electrical contact and mechanical attachment of the pillar to the contact pad on the semiconductor device with the pillar projecting outwardly from the semiconductor device;
   b. a solder crown having first and second extreme ends, the solder crown being positioned in axial alignment with the pillar with the first end of the solder crown facing the second end of the pillar, the solder crown being reflowable at a predetermined temperature into effecting electrical contact and mechanical attachment by the second end thereof with the conductor on the substrate; and
   c. a diffusion barrier electrically and mechanically joining the first end of the solder bump to the second end of the pillar, the diffusion barrier resisting electro-migration into the first end of the solder crown by a selected chemical constituent of the pillar, the diffusion barrier comprising a control layer of material on the second end of the pillar, the material of the control layer being chosen from the group consisting of palladium, alloys of titanium-tungsten, and tantalum nitride.

2. A bump contact as recited in claim 1, wherein the selected chemical constituent of the pillar comprises a material chosen from the group consisting of copper and gold.

3. A bump contact as recited in claim 1, wherein, by resisting electro-migration into the first end of the solder crown by a selected chemical constituent of the pillar, the diffusion barrier simultaneously resists counter-diffusion into the second end of the pillar by a selected chemical constituent of the solder crown.

4. A bump contact as recited in claim 3, wherein the selected chemical constituent of the solder crown comprises tin.

5. A bump contact as recited in claim 1, wherein the diffusion barrier has a thickness measured between the solder crown and the second end of the pillar, and the thickness of the diffusion barrier is in a range of from about 2 microns to about 20 microns.

6. A bump contact as recited in claim 1, wherein the solder crown is tin-based.

7. A semiconductor package comprising:
   a. a support substrate having a engagement surface carrying an electrical conductor thereupon;
   b. a semiconductor device having an electrical access surface bearing a contact pad through which the semiconductor device communicates electrically with the conductor on the support substrate, the semiconductor device being seated on the substrate with the engagement surface of the semiconductor device facing the engagement surface of the support substrate and the contact pad of the semiconductor device closely opposing the conductor on the support substrate;
   c. an electrically conductive pillar having first and second extreme ends, the first end of the pillar being in electrical contact with and mechanically attached to the contact pad on the semiconductor device, the pillar thereby projecting from the engagement surface of the semiconductor device toward the conductor on the support substrate;
   d. a reflowed solder crown having first and second extreme ends, the solder crown being in axial alignment with the pillar with the first end of the solder crown facing the second end of the pillar and with the second end of the solder crown being in electrical contact and mechanical attachment with the conductor on the support substrate;
   e. stabilization means between the second end of the pillar and the first end of the solder crown for retarding the growth at the second end of the pillar of a brittle intermetallic phase formation during operation of the semiconductor package; and
   wherein the stabilization means comprises a control layer of material interposed between the second end of the pillar and the first end of the solder crown, the material of the control layer being chosen from the group consisting of palladium, alloys of titanium-tungsten, and tantalum nitride.

8. A semiconductor package as recited in claim 7, wherein the stabilization means comprises a barrier to the electro-migration into the first end of the solder crown by a selected chemical constituent of the pillar.

9. A semiconductor package as recited in claim 8, wherein the selected chemical constituent of the pillar comprises a material chosen from the group consisting of copper and gold.

10. A semiconductor package as recited in claim 8, wherein, by resisting electro-migration into the first end of the solder crown by a selected chemical constituent of the pillar, the diffusion barrier simultaneously resists counter-diffusion into the second end of the pillar by a selected chemical constituent of the solder crown.

11. A semiconductor package as recited in claim 10, wherein the selected chemical constituent of the solder crown comprises tin.

12. A semiconductor package as recited in claim 7, wherein the control layer has a thickness measured between the solder crown and the second end of the pillar, and the thickness of the control layer is in a range of from about 5 microns to about 10 microns.

13. A method for making an electrical connection between a conductor on a support substrate and a contact pad on a semiconductor device mounted to the support substrate, the method comprising the steps:
   a. constructing an electrically conductive pillar having first and second extreme ends;

b. attaching the first end of the pillar electrically and mechanically to the contact pad on the semiconductor device with the pillar projecting outwardly from the semiconductor device;

c. applying to the second end of the pillar an electrically conductive control layer comprised of a material capable of resisting electro-migration of copper out of the pillar through the second end thereof, wherein the control layer is comprised a material chosen from the group consisting of palladium, alloys of titanium-tungsten, and tantalum nitride;

d. installing a reflowable solder crown on the side of the control layer opposite from the second end of the pillar;

e. positioning the semiconductor device in proximity to the support substrate with the pillar between the semiconductor device and the support substrate and with the solder crown contacting the conductor on the support substrate; and f. heating the solder crown sufficiently to cause reflow attachment of the solder crown electrically and mechanically with the conductor on the support substrate.

14. A method as recited in claim 13, wherein in the step of applying an electrically conductive control layer, the material capable of resisting electro-migration of copper is applied to the second end of the pillar using a method selected from the group consisting of electrolytic plating, electroless plating, and vapor deposition.

15. A method as recited in claim 13, wherein the reflowable solder crown is installed on the side of the control layer opposite from the second end of the pillar using a method selected from the group consisting of solder plating and solder ball attachment.

16. A method as recited in claim 13, wherein the wherein the control layer has a thickness measured between the solder crown and the second end of the pillar, and the thickness of the control layer is at least about 2 microns.

17. A bump contact for electrically connecting a substrate and a semiconductor device mounted to the substrate, the bump contact comprising:

a. an electrically conductive pillar having first and second extreme ends, the first end of the pillar being capable of effecting electrical contact and mechanical attachment of the pillar to the semiconductor device with the pillar projecting outwardly therefrom;

b. a control layer disposed on the second end of the pillar; and c. a solder crown secured to the control layer in axial alignment with the pillar, the solder crown being reflowable at a predetermined temperature into effecting electrical contact and mechanical attachment with the substrate;

wherein the control layer comprises a material chosen from the group consisting of palladium, alloys of titanium-tungsten, and tantalum nitride, and has a thickness measured between the solder crown and the second end of the pillar; and the thickness of the control layer is more than 10 microns to sufficiently retard formation of a brittle intermetallic compound phase between the electrically conductive pillar and the solder crown.

* * * * *